US006400741B1

(12) United States Patent
Matsunaga et al.

(10) Patent No.: US 6,400,741 B1
(45) Date of Patent: Jun. 4, 2002

(54) EMISSION TIMING CONTROL APPARATUS FOR PULSED LASER

(75) Inventors: Takashi Matsunaga; Akinori Matsui, both of Oyama (JP)

(73) Assignee: Komatsu Ltd., Tokyo (JP)

( * ) Notice: Subject to any disclaimer, the term of this patent is extended or adjusted under 35 U.S.C. 154(b) by 0 days.

(21) Appl. No.: 09/282,222

(22) Filed: Mar. 31, 1999

(30) Foreign Application Priority Data

Apr. 1, 1998 (JP) .......................................... 10-088845

(51) Int. Cl.[7] .............................. H01S 3/00; H01S 3/10; H01S 3/13
(52) U.S. Cl. ................ 372/38.02; 372/38.1; 372/38.03; 372/38.04; 372/38.07; 372/25; 372/37; 372/86; 372/29.01; 372/29.012; 372/29.015
(58) Field of Search ......................... 372/38.02, 38.03, 372/38.04, 38.1, 38.07, 37, 86, 25, 38.01, 38.08, 29.01, 29.011, 29.012, 29.013, 29.014, 29.015, 29.016; 307/106

(56) References Cited

U.S. PATENT DOCUMENTS

| 4,549,091 A | * | 10/1985 | Fahlen et al. ................ 307/106 |
| 5,177,754 A | * | 1/1993 | Ball et al. ................ 372/38.02 |
| 5,729,562 A | * | 3/1998 | Birx et al. ................ 372/38.04 |
| 5,914,974 A | * | 6/1999 | Partlo et al. ............. 372/38.08 |
| 6,005,880 A | * | 12/1999 | Basting et al. ........... 372/38.04 |
| 6,016,325 A | * | 1/2000 | Ness et al. ................ 372/38.07 |
| 6,020,723 A | * | 2/2000 | Desor et al. ................ 320/166 |

FOREIGN PATENT DOCUMENTS

DE 384202 6/1989

* cited by examiner

Primary Examiner—Quyen Leung
Assistant Examiner—James Menefee
(74) Attorney, Agent, or Firm—Varndell & Varndell, PLLC

(57) ABSTRACT

An emission timing control apparatus for a pulsed laser including a magnetic pulse compression circuit having a switching section for carrying out a switching operation to connect and disconnect a charging power source to and from the magnetic pulse compression circuit. The pulsed laser executes pulsed laser oscillation at a prescribed repetition frequency by turning on the switching section with a pulse oscillation synchronizing signal having the prescribed repetition frequency received from a semiconductor exposure apparatus, in which the emission timing control apparatus includes a reference delay time setting section for setting a prescribed reference delay time, and delay section for delaying a pulse oscillation synchronizing signal received from the semiconductor exposure apparatus by the time difference $\tau$ calculated in the delay time calculating section and outputting to the switching section.

8 Claims, 10 Drawing Sheets

FIG.3(a) WHEN $V_0 = V_S$
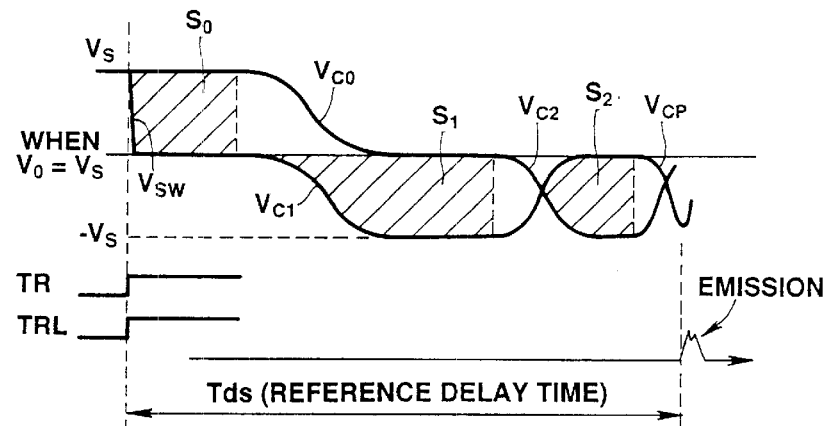
FIG.3(b) TR
FIG.3(c) TRL
EMISSION
Tds (REFERENCE DELAY TIME)
FIG.3(d) WHEN $V_0 = V_a$ ($V_a \geqq V_S$)
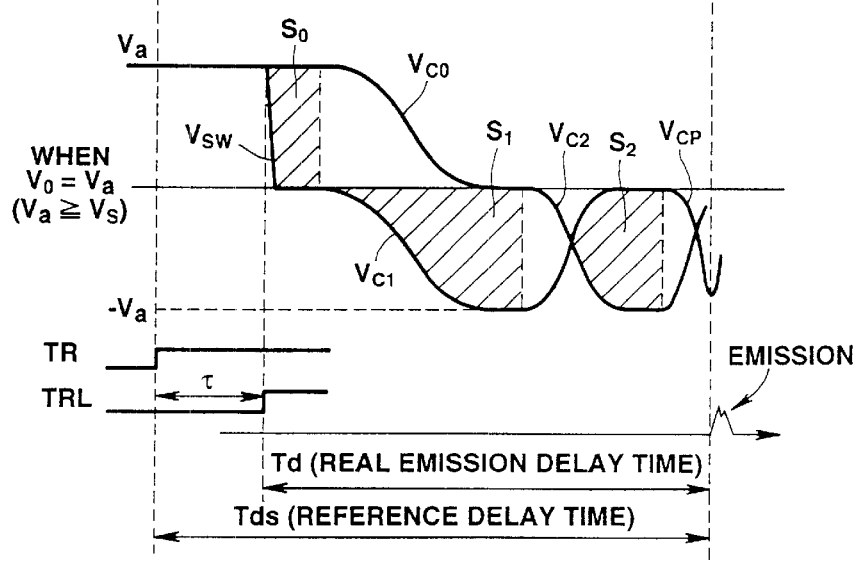
FIG.3(e) TR
FIG.3(f) TRL
EMISSION
Td (REAL EMISSION DELAY TIME)
Tds (REFERENCE DELAY TIME)

EMISSION TIMING CONTROL APPARATUS FOR PULSED LASER

BACKGROUND OF THE INVENTION

1. Field of the Invention

The present invention relates to an emission timing control apparatus for pulsed lasers, effecting pulsed laser emission by exciting a laser medium through pulsed discharge at a prescribed frequency of repetition using a magnetic pulse compression circuit, which improves the precision of synchronizing the emission timing of the pulsed laser with the control timing for the semiconductor exposure apparatus.

2. Description of the Related Art

Much attention is being given to the use of excimer lasers as exposure sources for reduced projection exposure apparatuses (referred to below as steppers) for semiconductor manufacturing. These are expected to provide a great many advantages: the possibility of extending the limits of the exposure light to below 0.5 μm with the short wavelengths of excimer lasers (the wavelength for KrF is 248.4 nm); deeper focal depth than the g lines and i lines of the mercury lamps, which are usually used and which have the same resolution; increasing the exposure area with a small numerical aperture (NA) lens; and achieving high power.

FIG. 9 shows the general constitution of the control system for an excimer laser 1 and a stepper 10.

The excimer laser 1 comprises the following:

a laser chamber 2 housing discharge electrodes or the like;

a pulse power source apparatus 3 for applying the high frequency voltage, synchronized with the frequency of repetition of the pulsed discharge, between the discharge electrodes;

an energy monitor 4 to monitor the energy, wavelength, and the like of the laser beam output from the laser chamber 2; and a laser controller 5 to supply and control laser gas, control laser oscillation wavelength, and control the power source voltage of the pulse power source apparatus 3, on the basis of the monitoring values from the energy monitor 4 and the energy command E from the stepper 10.

The stepper 10 comprises a movable wafer table 12 whereon wafers are mounted and a stepper controller 11 to transfer the pulse oscillation synchronizing signal TR, which is the trigger signal for repeated pulse oscillation, and the target energy command E for laser oscillation to the excimer laser. The wafers on the wafer table 12 are exposed with a reduced projection system using the laser beam from the excimer laser.

In recent years, magnetic pulse compression circuits have come to be used as the pulsed power source apparatus 3 in FIG. 9; these improve the durability of the main switch of a cyclotron, GTO, or the like. FIG. 10 shows an equivalent circuit for a capacitance switching, magnetic pulse compression discharge apparatus. FIG. 11 shows a waveform diagram of the voltage and current in each portion of the circuit in FIG. 10.

The discharge circuit in FIG. 10 is a two-stage magnetic pulse compression circuit utilizing the saturation phenomena of three magnetic switches AL0–AL2 comprising saturable reactors.

The energy command value E is input from the stepper 10 before the first laser oscillation trigger signal is received. The laser controller 5 therefore calculates the power source voltage necessary to output this energy and adjusts the voltage of the high voltage power source HV based on this calculated value. At this time, the capacitor C0 is precharged with a charge from the high voltage power source HV by means of the magnetic switch AL0 and coil L1.

Afterwards, the main switch SW is turned on when the first pulse oscillation synchronizing. signal (trigger signal) TR is received from the stepper 10 (FIG. 11, time t0). When the main switch SW is turned on, the potential VSW of the main switch abruptly drops to 0. After that, the time product (time integral value of voltage VC0) S0 of the voltage difference VC0−VSW of the main switch SW and the capacitor C0 reaches the limit value determined by the settings of the magnetic switch AL0. VC0 and VSW are the voltage of both terminals of the magnetic switch AL0. At that time t1, the magnetic switch AL0 becomes saturated and the current pulse i0 flows through the loop formed by the capacitor C0, magnetic switch AL0, main switch SW, and capacitor C1.

The time δ0, from when that current pulse i0 starts to flow until it becomes zero (time t2), is determined by the inductance and capacitance of the capacitor C0, magnetic switch AL0, and capacitor C1, if loss due to the main switch SW or the like is ignored. More specifically, the charge transfer time 0 is the time necessary for charge to move completely from the capacitor C0 to the capacitor C1.

Meanwhile, the time product S1 of the voltage VC1 of the capacitor C1 reaches the limit value determined by the settings of the magnetic switch AL1. At this time t3, the magnetic switch AL1 becomes saturated and has low inductance. As a result, the current pulse i1 flows in the loop formed by the capacitor C1, capacitor C2, and magnetic switch AL1. This current pulse i1 becomes zero at time t4 once the prescribed transfer time 1, determined by the inductance and capacitance of the magnetic switch AL1 and capacitors C1, C2, has passed.

Also, the time product S2 of the voltage VC2 of the capacitor C2 reaches the limit value determined by the settings of the magnetic switch AL2. At this time t5, the magnetic switch AL2 becomes saturated, causing the current pulse i2 to flow through the loop formed by the capacitor C2, peaking capacitor CP, and magnetic switch AL2.

The voltage VCP of the peaking capacitor CP rises throughout the charging process. At the time t6 when this voltage VCP reaches the prescribed main discharge initiation voltage, the laser gas between the main electrodes 6 undergoes dielectric breakdown and the main discharge starts. The laser medium is excited by this main discharge and a laser beam is emitted after several nanoseconds.

This type of discharge action is performed repeatedly by the switching action of the main switch 5 synchronized with the trigger signal TR; as a result, pulsed laser oscillation is effected at the prescribed repetition frequency (pulse oscillation frequency).

The magnetic compression circuit shown in FIG. 10 is set so that the inductance of each stage of the charge transfer circuit, composed of magnetic switches and capacitors, progressively decreases in farther stages. Pulse compression is carried out so that the peak values of the current pulses i0 i2 gradually increase and the current amplitude gradually narrows. As a result, a strong discharge is attained between the main electrodes 6 in a short period of time. Also, each magnetic switch AL0–AL2 is reset at each pulse to the initial state with the reset circuit of a saturable reactor. The saturation point (action point) of each magnetic switch AL0–AL2 is the same for the voltage and becomes uniform from pulse to pulse.

With the abovementioned magnetic compression circuit, however, the saturation time $\alpha 0$ ($\delta 0 + \alpha 1$), ($\delta 1 + \alpha 2$) of each magnetic switch AL0–AL2 that is determined by the voltage time product changes when the initial charging voltage V0 changes. Accordingly the time td (referred to below as emission delay time) changes as well. The time td is from the time t0 when the trigger TR is input and the magnetic switch SW called up until the time t6 when the laser beam is actually emitted.

In an excimer laser, as discussed above, the power source voltage V0 is one of control parameters for maintaining uniform laser output and can be varied during laser operation. Specifically, power source voltage V0 is variably controlled with consideration given to various factors such as power lock control for controlling power source voltage taking into consideration the drop in laser output due to a decrease in halogen gas, and spike-killer control for controlling power source voltage in order to resolve the spiking phenomenon wherein laser output becomes high in the spike zone, including the initial pulses of continuous pulse operation, compared to other zones.

In this way, the power source voltage V0 is one control parameter for an excimer laser; it is impossible to make the power source voltage uniform. The emission delay time td at each pulse oscillation is therefore varied according to the command voltage V0 at that time.

In a conventional system, the pulse oscillation synchronizing signal TR sent from the stepper 10 is used without further processing as a trigger signal for the main switch 5. In such a system, the emission delay time, from when the pulse oscillation synchronizing signal is generated until the laser beam is actually emitted, is different for each pulse. A problem is that it is therefore difficult to synchronize laser emission timing with stepper control timing in the stepper 10.

Especially in the case of the exposure system in the stepper 10 being a step & scan system, the stage (or laser beam) is moved during the exposure process. If the actual emission timing of each pulsed laser in the excimer laser is not completely synchronized with the timing for controlling the movement of the wafer (or laser beam) in the stepper, specifically if the pulsed laser beam is not emitted during the period while the stage is still, the stage moves during laser irradiation and the amount of exposure at each position varies greatly. For this reason, before now, the time from when the stepper outputs the pulse oscillation synchronizing signal TR until laser oscillation actually occurs was predicted based on experience and measurement data. The various types of control within the stepper were synchronized on the basis of this prediction.

Moreover, the step & scan system carries out the exposure process as the laser beam or wafer is shifted by a prescribed pitch ΔP for the case where a laser beam, called a sheet beam, is shone on an integrated circuit chip 7 on a wafer as shown in FIG. 12. In this instance, exposure is made equal for all points on the IC chip 7 by setting the scanning pitch ΔP and sheet beam radiation field so that the cumulative exposure (in FIG. 12, for example, the cumulative exposure for point A is P1+P2+P3+P4) for each position on the IC chip 7.

In the background art, the actual emission timing is predicted on the stepper side, but the actual emission timing varies depending on power source voltage and the like; thus, the predicted emission timing does not match the actual emission timing. A consequent problem is poor synchronization between laser emission timing and control timing on the stepper side.

SUMMARY OF THE INVENTION

The present invention was made in view of this situation; it is therefore an object of the present invention to provide an emission timing control apparatus for pulsed lasers, with more precise synchronization synchronicity between laser emission timing and control timing for the semiconductor exposure apparatus, so as to make uniform from pulse to pulse the time from when the pulse oscillation synchronizing signal is received until actual laser emission.

The invention corresponding to a first aspect of the invention relates to an emission timing control apparatus for a pulsed laser comprising: a magnetic pulse compression circuit including a multi-stage charge transfer circuit comprised of a plurality of magnetic switches connected serially to a charging power source and a plurality of capacitors connected parallel to the charging power source, for compressing current pulses in a plurality of stages using the multi-stage charge transfer circuit; switching means for carrying out a switching operation to connect and disconnect the charging power source to and from the magnetic pulse compression circuit; a laser discharge electrode connected to an output terminal of the magnetic pulse compression circuit; and control means for outputting a voltage command value to the charging power source, the pulsed laser executing pulsed laser oscillation at a prescribed repetition frequency by turning on the switching means with a trigger, being a pulse oscillation synchronizing signal having the prescribed repetition frequency received from a semiconductor exposure apparatus, wherein the emission timing control apparatus comprises: reference delay time setting means for setting a prescribed reference delay time in advance, the prescribed reference delay time being greater than a maximum value of a variable range of a real emission delay time from when the switching means is turned on until laser oscillation begins; delay time calculating means for calculating for each pulse oscillation a difference between the preset reference delay time and the real emission delay time for a pertinent pulse oscillation corresponding to the voltage command value output from the control means; and delay means for delaying a pulse oscillation synchronizing signal received from the semiconductor exposure apparatus by the time difference calculated in the delay time calculating means and outputting it to the switching means.

With the first aspect of the invention, the prescribed reference delay time is set in advance. The prescribed reference delay time is greater than the maximum value of the variable range of the real emission delay time from when the switching means is turned on until laser oscillation begins. As discussed below, for example, this reference delay time may be the time from when the abovementioned switching means is turned on until laser oscillation begins, in the case of laser oscillation at a prescribed voltage value less than the minimum value for the voltage command value. Then, the difference between this reference delay time and the real emission delay time for the pertinent pulse oscillation is found for each pulse oscillation; the pulse oscillation synchronizing signal received from the semiconductor exposure device is delayed by this difference and output to the switching means. The time from when the laser oscillation pulse synchronizing signal is received until the laser beam is actually emitted is thereby caused to match the abovementioned established reference delay time for each pulse.

With the present invention, the time from reception of the laser oscillation pulse synchronizing signal until actual laser emission becomes uniform for each pulse. As a result, the laser emission timing can be completely synchronized with the control timing of the semiconductor exposure device without requiring the very difficult prediction control in the semiconductor device.

In the second aspect of the invention, the delay time calculating means in the first aspect of the invention finds the real emission delay time of the pertinent pulse oscillation according to an ambient temperature of the magnetic pulse compression circuit and the voltage command value output from the control means, and outputs a difference between the preset reference delay time and the real emission delay time of the pertinent pulse oscillation to the delaying means.

The second aspect of the invention compensates for the ambient temperature of the magnetic pulse compression circuit, as well as variations in power source voltage, and control the emission delay times so they are uniform. As a result, the precision to which the laser emission timing can be synchronized with the control timing for the semiconductor exposure device can be further improved.

In the third aspect of the invention, the upper limit value of voltage command value is a established so that a charge transfer time among the capacitors matches a saturation time of the magnetic switch.

The third aspect of the invention in sets the maximum value of power source voltage so that the charge transfer time among the capacitors matches the saturation time for the magnetic switches and controls power source voltage with a range such that this maximum voltage value is not exceeded. This invention therefore prevents the drop in current pulse peak value and the increase in current amplitude, as well as the situation where the magnetic switches become saturated during the charge transfer among capacitors.

BRIEF DESCRIPTION OF THE DRAWINGS

FIGS. 3(a) to 3(f) are timing charts showing the pulse oscillation synchronizing signal and voltage waveform for each portion of the magnetic compression circuit to show the action of the present invention;

DESCRIPTION OF THE PREFERRED EMBODIMENTS

The preferred embodiments of the present invention are explained in detail below with reference to the attached figures.

Figure 2:
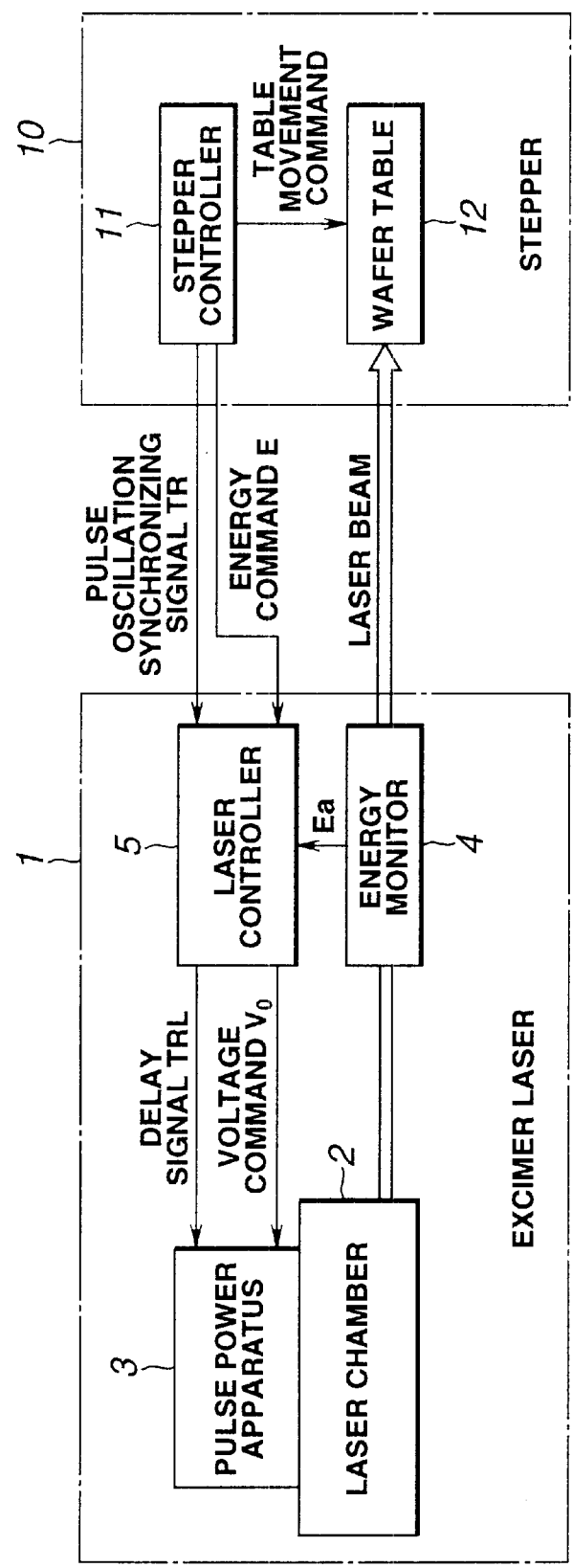
FIG. 2 is a block diagram showing the constitution of the control system for the stepper and excimer laser to which the present invention is applied.
Figure 9:
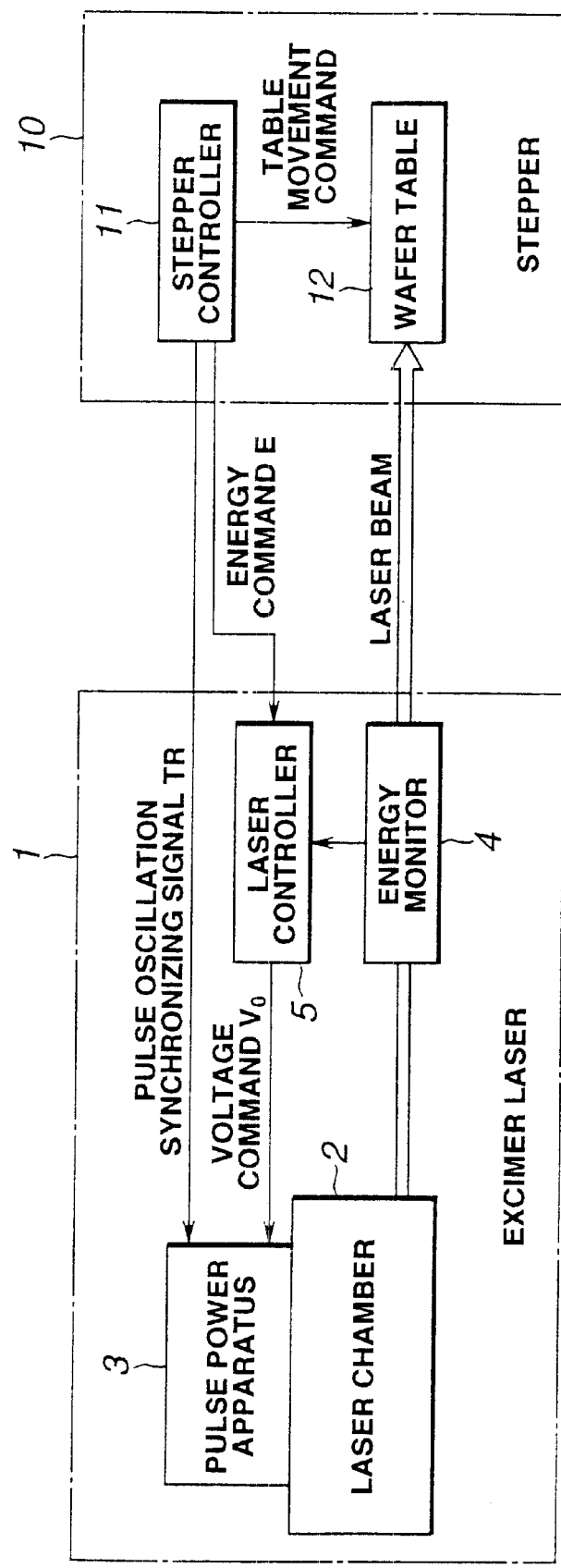
FIG. 9 shows the constitution of the conventional control system for excimer laser and stepper.

FIG. 2 shows the constitution of the control system for an excimer laser 1 and stepper 10 relating to an embodiment of the present invention. Unlike the constitution shown in FIG. 9 noted above, the laser controller 5 delays (details below) the pulse oscillation synchronizing signal TR received from the stepper 10 in accord with the power source voltage command V0 and inputs the delay signal TRL to the pulse power circuit 3.

Figure 1:
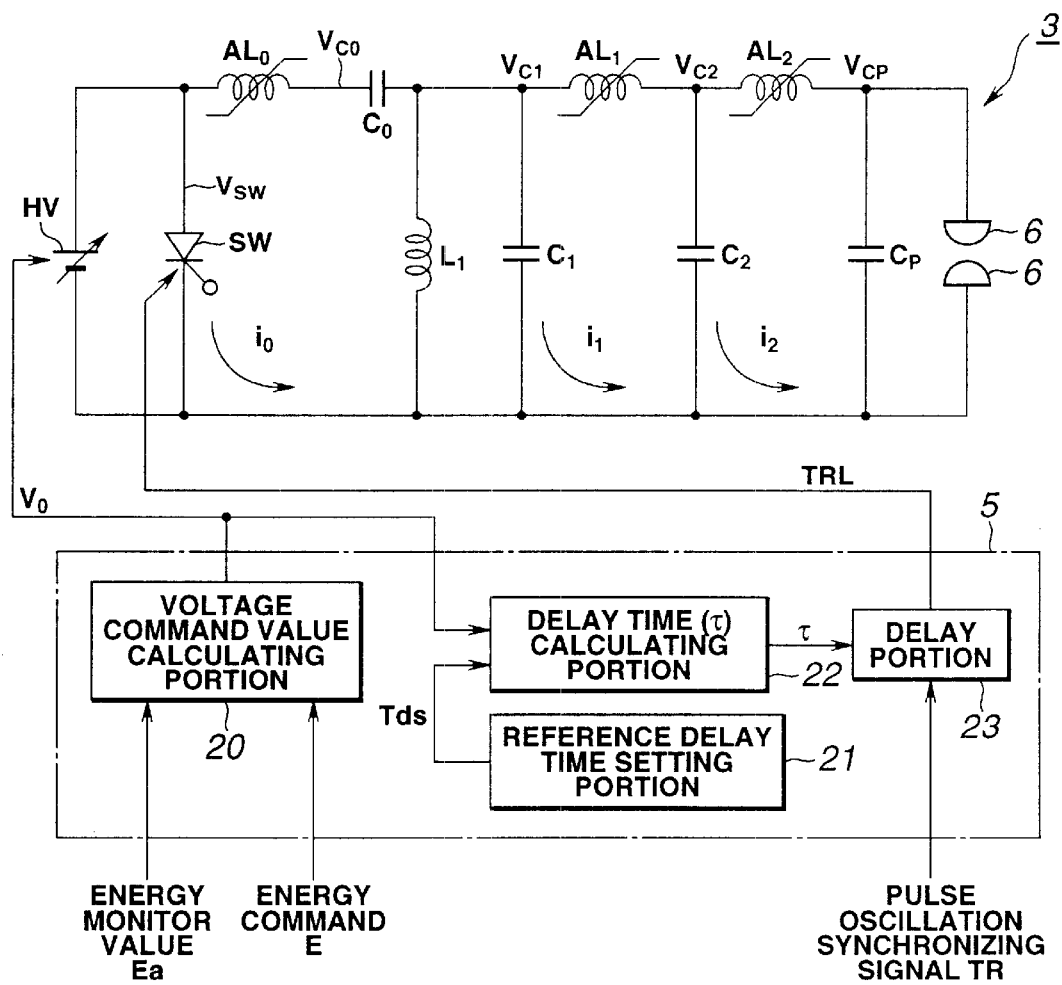
FIG. 1 is a circuit block diagram showing an embodiment of the present invention.

FIG. 1 shows an example of the internal constitution of the pulse power circuit 3 and laser controller 5.

Figure 10:
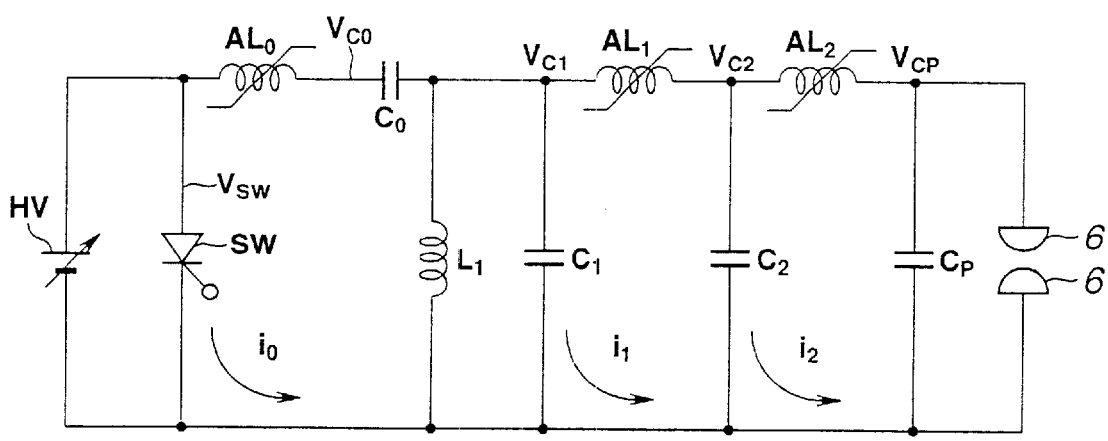
FIG. 10 is a diagram showing a usual magnetic compression circuit.

As in FIG. 10, the same type of two-stage magnetic pulse compression circuit is used as the pulse power circuit 3; a redundant explanation thereof is omitted.

Using the energy monitor value Ea input from the energy monitor 4 as the feedback signal, the voltage command computing portion 20 of the laser controller 5 calculates the voltage command value V0 necessary to output the energy. in accord with the energy command value E input from the stepper 10, and outputs this calculated value V0 to the high voltage power source HV and delay time computing portion 21.

In this case, the voltage command value V0 may be adjusted within the range of $Vmin \leq V0 \leq Vmax$.

Figure 11:
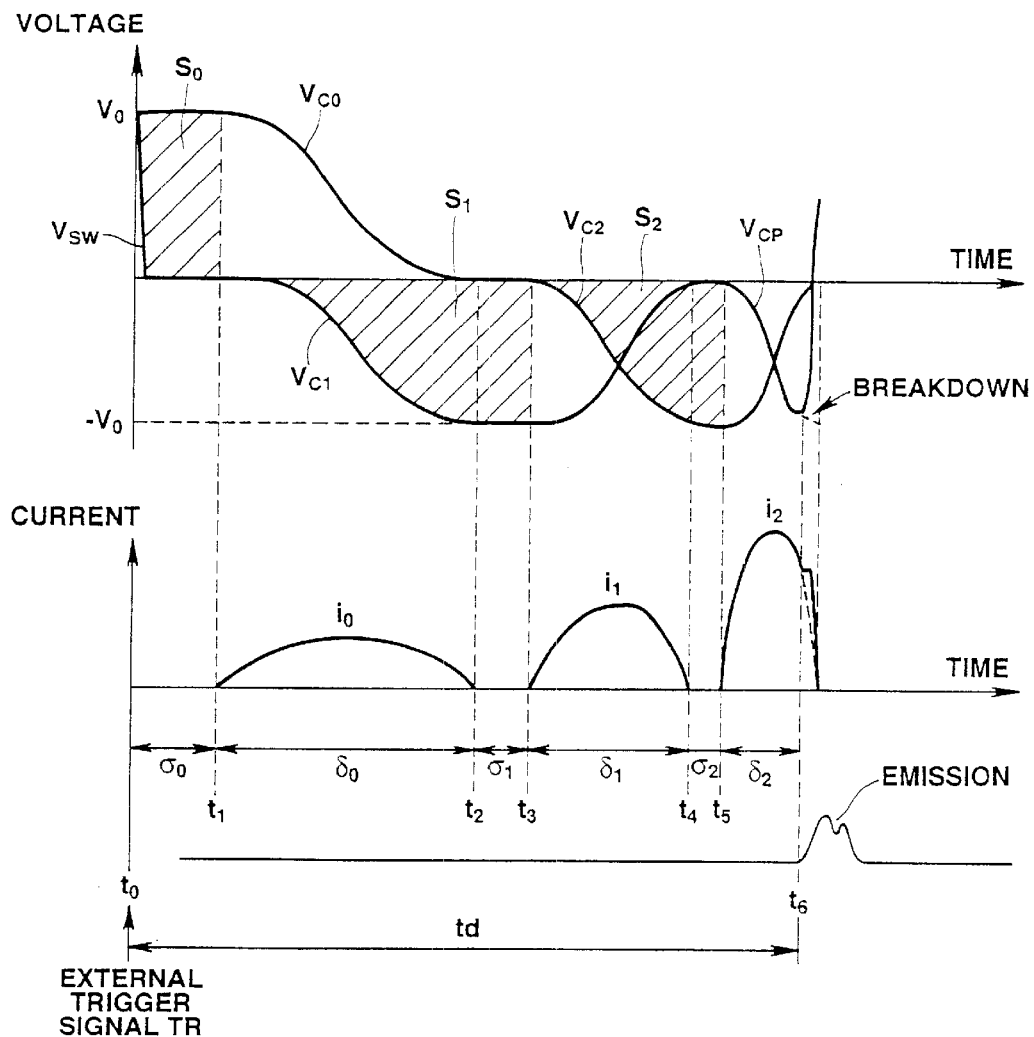
FIG. 11 shows the current waveform and voltage for each portion of the magnetic compression circuit.
Figure 12:
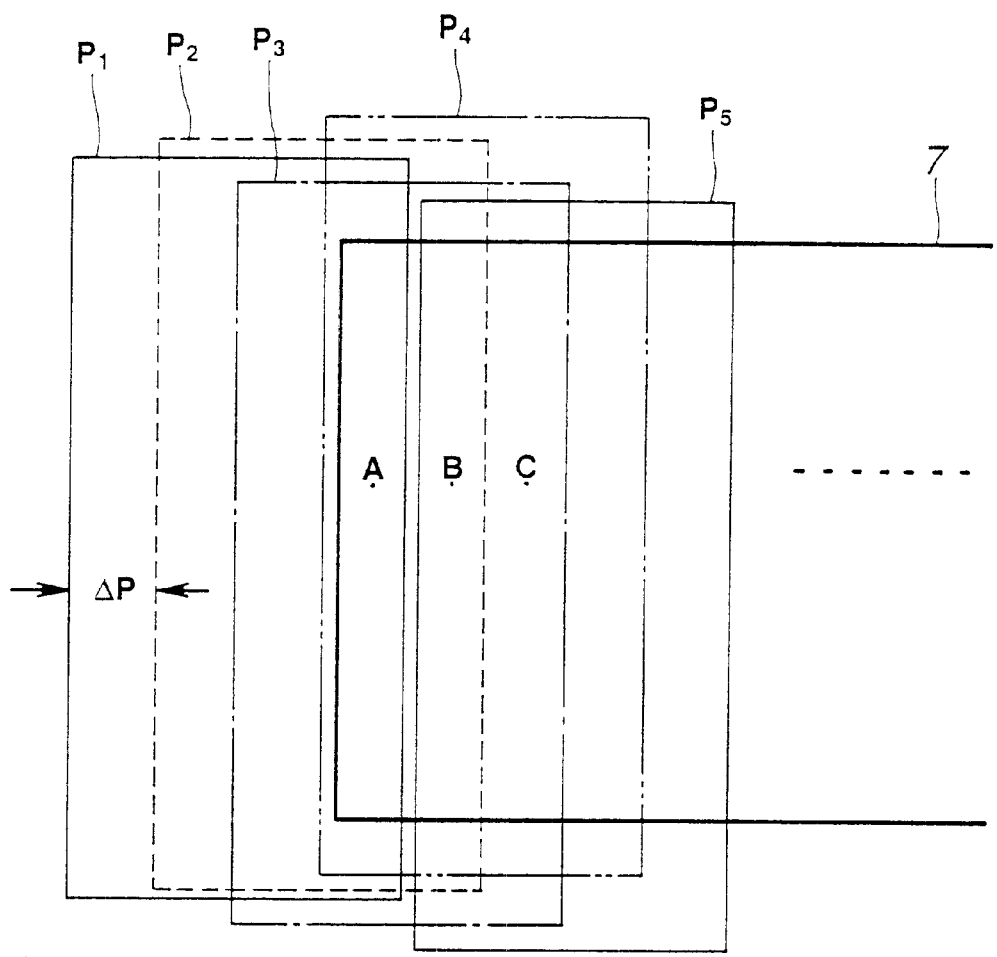
FIG. 12 explains reduced projection exposure with the step-scan system.

In this case, moreover, the maximum value Vmax of the power source voltage V0 is set so that the charge transfer time between capacitors C0–C2, Cp matches the saturation time of the magnetic switches AL0–AL2, specifically, so that $\sigma 0$–$\sigma 2$ in FIG. 11 becomes 0. The power source voltage is controlled so as to be within a range not exceeding this maximum voltage value Vmax. As a result, the situation wherein the magnetic switches become saturated during charge transfer among the capacitors, specifically where $\sigma 1$ and $\sigma 2$ become negative values, does not occur. A drop in the peak value of the current pulse and an increase in the current amplitude are thereby prevented.

The constitution of the reference delay time setting portion 21, delay time computing portion 22, and delay portion 23 allows the time from when the laser oscillation pulse synchronizing signal TR is received by the excimer laser 1 until the laser actually emits light to be the same for each pulse.

A prescribed reference delay time Tds, which is greater than the maximum value of the variable range of the emission delay time from when the main switch SW is turned ON until laser oscillation actually starts, is preset in the reference delay time setting portion 21. For example, a prescribed voltage value Vs ($\leq Vmin$) is determined; this voltage value Vs is less than or equal to the minimum voltage Vmin in the $Vmin \leq V0 \leq Vmax$ range in which the voltage command value V0 may be adjusted. The reference delay time Tds is set as the oscillation delay time from when the main switch SW is turned on until laser oscillation actually begins, when laser oscillation is effected with that voltage Vs. The reference time Tds set in the reference delay time setting portion 21 is input to the delay time calculating portion 22.

On the basis of the voltage command value V0 which was input, the delay time calculating portion 22 calculates in advance the actual emission delay time td when laser oscillation is carried out with the voltage command value V0. Meanwhile, the delay time calculating portion 22 also finds the difference between the abovementioned reference delay time Tds and the real emission delay time td and outputs this difference to the delay portion 23 as the delay time $\tau$ (=Tds−td). In other words, the voltage command V0 output from the voltage command value calculating portion 20 is a value much greater than the power source voltage Vs used to find the reference delay time Tds (V0$\geq$Vs). The real emission delay time td, calculated in advance by the delay time calculating portion 22, therefore becomes much smaller than the reference delay time Tds. The difference between those is calculated as the delay time τ. Specifically, the saturation time for the magnetic switches AL0–AL2 becomes shorter as the power source voltage V0 becomes greater; as a result, the real emission delay time td also becomes shorter.

The delay portion 23 delays the received pulse oscillation synchronizing signal TR by the delay time τ input from the delay time calculating portion 22 and outputs this delayed signal TRL to the main switch SW.

As a result, for each pulse oscillation, the time from when the delay portion 23 receives the pulse oscillation synchronizing signal TR until laser emission actually occurs becomes the real emission delay time .td plus the delay time τ (=reference delay time Tds) and therefore matches with the reference delay time Tds which is a constant value.

FIG. 3(a) shows the voltage waveform in each portion of the magnetic pulse compression circuit in FIG. 1, for laser oscillation with the power source voltage V0 as the voltage Vs for setting the abovementioned reference delay time Tds. FIG. 3(d) shows the voltage waveform for each portion of the magnetic pulse compression circuit for laser oscillation when the power source voltage V0 is the prescribed voltage Va, which is greater than the abovementioned voltage Vs. These share a common time axis.

A comparison of these voltage waveforms shows the following. When the initial charging voltage (command voltage) V0 becomes high, the portions (S0, S1, S2) of the voltage time product contract along the time axis and the saturation time of each magnetic switch AL0–AL1 becomes short.

Consequently, in the case where the initial charging voltage V0 is a low Vs, the reference delay time Tds is required from when the pulse oscillation synchronizing signal Tr is applied to the main switch SW until actual laser emission, as shown in FIG. 3(a). As shown in FIG. 3(b), however, in the case where the initial charging voltage V0 is a large Va, only the time td (<Tds) is required from when the pulse oscillation synchronizing signal Tr is applied to the main switch SW until actual laser emission.

The delay time calculating portion 22 in FIG. 1 calculates the real emission delay time td in advance, subtracts this real emission delay time td from the reference delay time Tds, and outputs that difference (Tds–td) as the delay time τ to the delay portion 23. The delay time portion 23 forms the delay signal TRL, delayed by just this delay time τ, from the received pulse oscillation synchronizing signal TR and outputs this delay signal TRL to the main switch SW. As shown in FIG. 3, the reference delay time Tds matches the time from when the laser controller 5 (in delay portion 23) receives the pulse oscillation synchronizing signal TR until actual laser emission.

Figure 4:
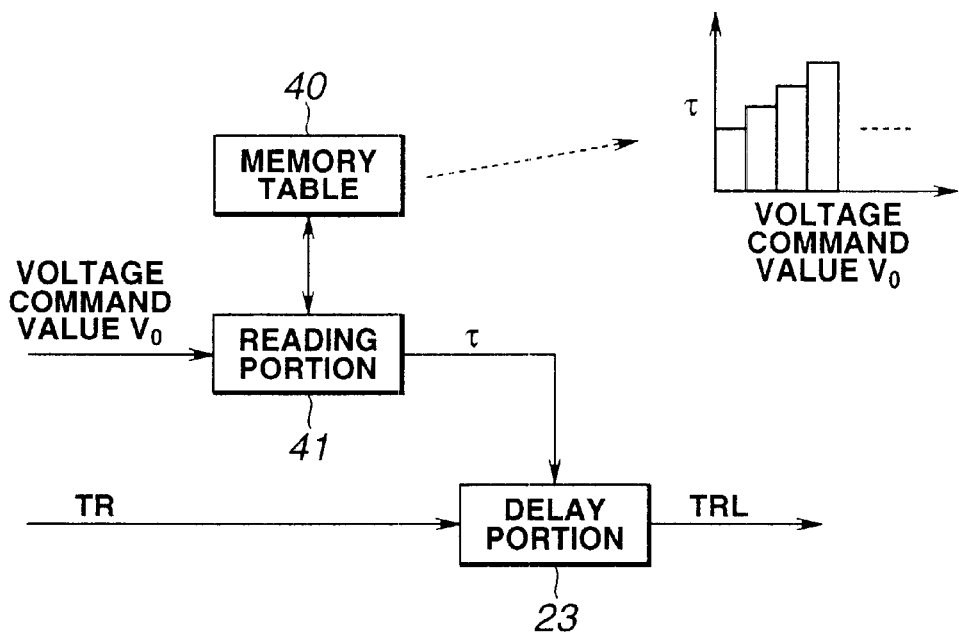
FIG. 4 is a diagram showing an example of the internal constitution of the delay time calculating portion.

FIG. 4 shows an example of the delay time calculating portion 22. Delay times τ corresponding to a plurality of different power source voltages V0 are stored in advance in a memory table 40. These delay times τ are real emission delay times td measured for each power source voltage V0 with various modifications; the appropriate value for each power source voltage V0 is calculated in advance and stored in the memory table 40.

Consequently, when laser oscillation is actually carried out, the delay time τ corresponding to the pertinent power source voltage V0 is read by the reading portion 41 for each pulse oscillation and output to the delay portion 23. The pulse oscillation synchronizing signal TR is thereby delayed by the delay time τ. Moreover, when a power source voltage V0 not in the memory table 40 is input, the reading portion 41 reads delay times τ1, τ2, corresponding to two power source voltages V01, V02 (V01<V0<V02), from the memory table 40, and performs linear interpolation using these to find a delay time τ corresponding to V0.

Figure 5:
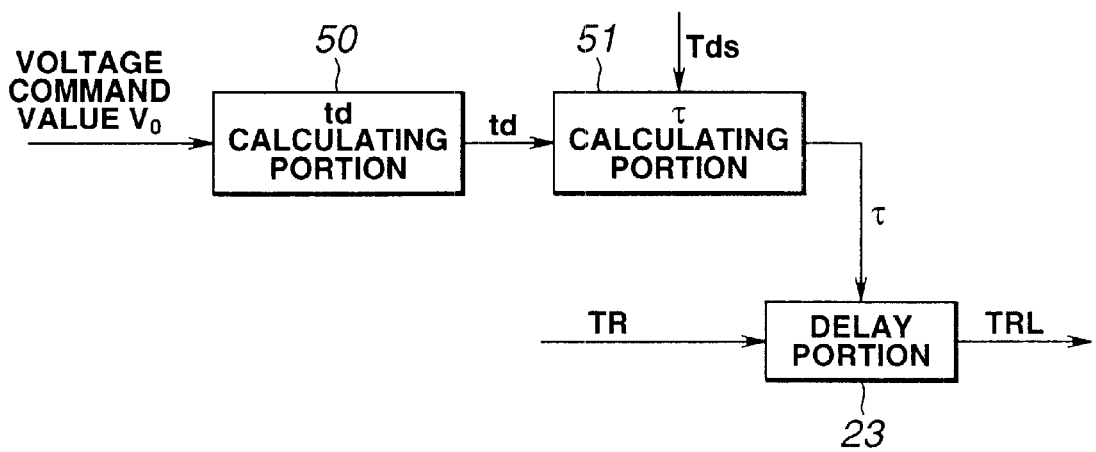
FIG. 5 is a diagram showing another example of the internal constitution of the delay time calculating portion.

FIG. 5 shows another example of the delay time calculating portion 22. In this case, the delay time corresponding to the power source voltage V0 is actually found by a hyperbolic approximation.

The td calculating portion 50 calculates in advance the real emission delay time td, corresponding to the pertinent power source voltage command; the program or circuit is therefore set to correspond to the following hyperbolic approximation $$td=(a/V0)+b \quad (1)$$

Moreover, the parameters a, b in the equation are calculated in advance: the real emission delay times td1, td2 during laser oscillation using two different power source voltages V01, V02 are measured and the parameters are calculated using these measured values and the power source voltages V01, V02.

The td calculating portion 50 calculates the real emission delay time td corresponding: to the power source voltage command V0 input for each pulse oscillation based on the abovementioned equation (1) and outputs this calculated value td to the calculating portion 51. The τ calculating portion 51 subtracts the input real emission delay time td from the established reference delay time Tds and outputs the subtraction results τ (=Tds–td) to the delay portion 23.

Figure 6:
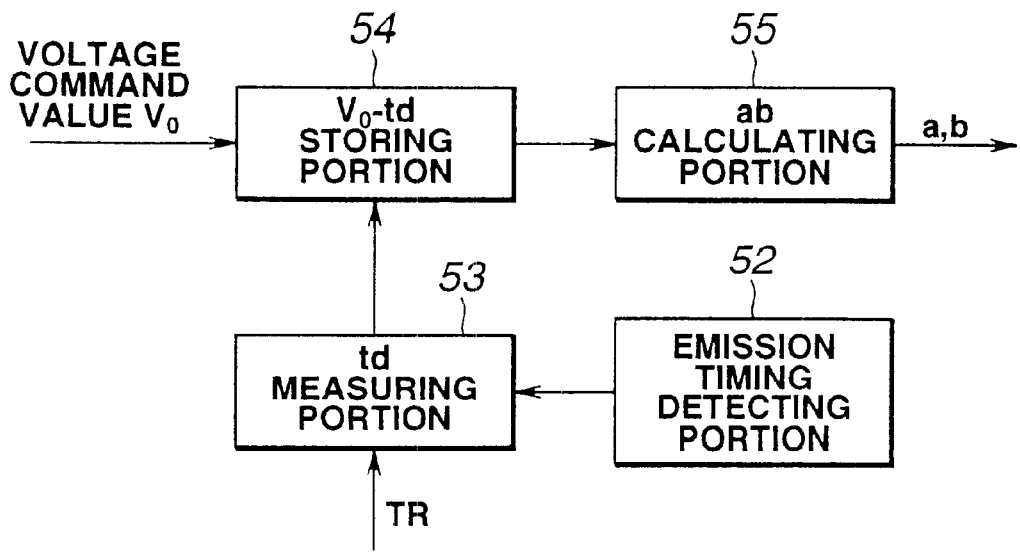
FIG. 6 shows a modification of the delay time calculating portion in FIG. 5.

FIG. 6 shows the constitution for automatically generating the parameters a, b in the abovementioned hyperbolic approximation (1).

Figure 7:
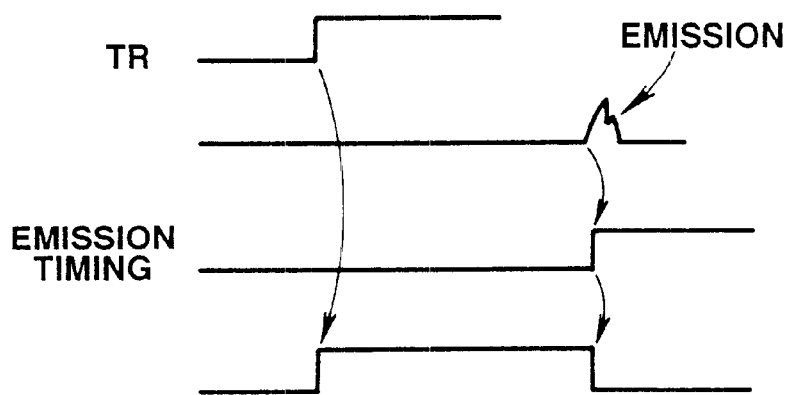
FIG. 7 is a timing chart to explain the operation of the constitution in FIG. 6.

An emission timing detecting portion 52 samples an appropriate part of the laser beam and outputs an emission timing signal showing the actual emission time of the laser beam. As shown in FIG. 7, a td measuring portion 53 measures pulse oscillation synchronizing signal TR and the real emission delay time td, from the application of the pulse oscillation synchronizing signal TR to the main switch SW until actual laser emission, on the basis of the emission timing signal and outputs those measured values to the V0–td storing portion 54.

The V0–td storing portion 54 stores each measured value td1, td2, td3 . . . with correspondence to the power source voltage command value V0 (V01, V02, V03, . . . ) at that time. The ab calculating portion 55 calculates the parameters a, b multiple times, using the plurality of groups of td values and V0 values stored in the V0–td storing portion 54, and finds the ultimate parameter values a, b by finding the mean values of those iterations. Then, the parameter values a, b found in this way are input to the td calculating portion 50 shown in FIG. 5; the parameters a, b for the abovementioned hyperbolic approximation formula (1) are periodically updated.

Figure 8:
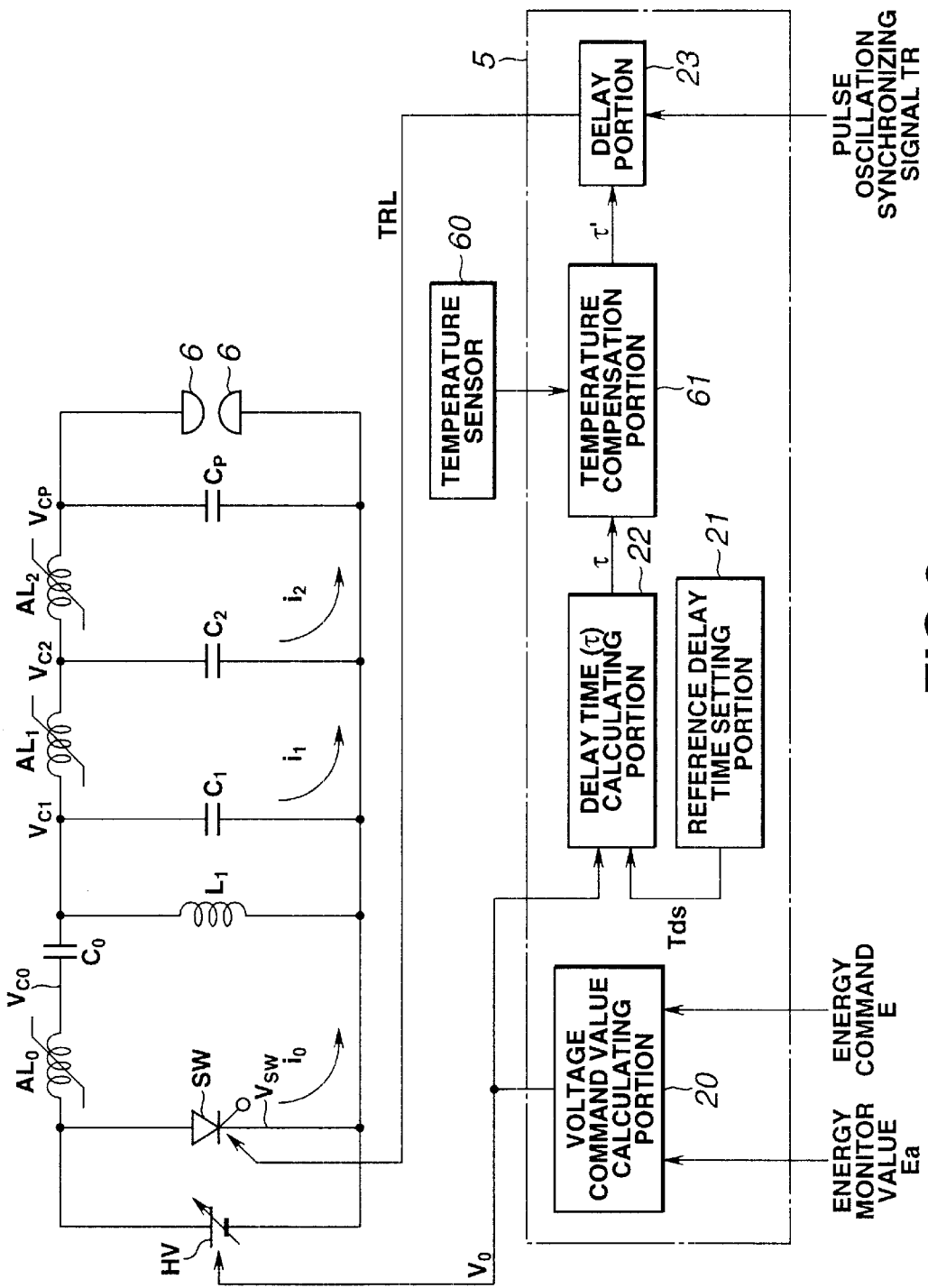
FIG. 8 is a circuit block diagram showing another embodiment of the present invention.

FIG. 8 shows another embodiment of the present invention. In this case, the abovementioned delay time τ' is found with consideration given to dispersion of the real emission delay time td due to the ambient temperature of the magnetic compression circuit, as well as the power source voltage V0; the pulse oscillation synchronizing signal TR is delayed by this delay time τ'.

In other words, the emission delay time is varied by the current amplitude δ0, δ1, δ2 (see FIG. 11) of the current pulses i0, i1, i2, as well as the saturation time of the magnetic switches AL0–AL2. The current amplitude (charge transfer time) δ0, δ1, δ2 is determined by the inductance and capacity of the magnetic switches and capacitors included in each level of the charge transfer circuit. This is therefore influenced by the ambient temperature within the magnetic compression circuit.

The reference delay time Tds established and stored in the reference delay time setting portion 21 in FIG. 8. In this case, the value is established when the temperature is a prescribed reference temperature u0 and the power source voltage V0 is a prescribed voltage Vs less than the minimum voltage Vmin as discussed above. As discussed above, the delay time calculating portion 21 calculates the real emission delay time td, for when laser oscillation is carried out with the pertinent voltage command value V0, on the basis of the input voltage command value V0, finds the difference between this calculated value td and the abovementioned reference delay time Tds, and outputs this difference as the delay time $\tau$ (=Tds−td) to the temperature compensation portion 61.

The temperature sensor 60 detects the ambient temperature u of the magnetic compression circuit and outputs that detected temperature u to the temperature compensation portion 61.

The temperature compensation portion 61 comprises a memory table for storing a plurality of ambient temperatures u and correlations of delay times $\epsilon$ (This delay time $\epsilon$ is related only to temperature changes) corresponding to these ambient temperatures u. Specifically, the real emission delay time td is measured for various temperatures u, with the power source voltage V0 being the voltage Vs used for setting the abovementioned reference delay time Tds. The differences $\epsilon$ (=Tds−td) between these measured values td and the reference delay time Tds, when the power source voltage V0 is the abovementioned voltage Vs and the temperature is the prescribed reference temperature u0, are found; these differences $\epsilon$ are stored with correspondence to the ambient temperature u.

The temperature controlling portion 61 reads the delay time corresponding to the value u detected by the temperature sensor from the abovementioned memory table and adds the delay time $\epsilon$, with respect to temperature, to the delay time $\tau$, relating only to power source voltage input from the delay time calculating portion 21. This sum $\tau'$ (=$\tau+\epsilon$) is output to the delay portion 23 as the ultimate delay time $\tau'$.

In the delay portion 23, the pulse oscillation synchronizing signal TR is delayed by the delay time $\tau'$ and applied to the main switch SW. Consequently, this embodiment compensates for changes in ambient temperature and in power source voltage and is able to make the length of time from when the pulse oscillation synchronizing signal TR is received by the excimer laser (or the pulse oscillation synchronizing signal is sent by the stepper 10) until actual laser emission uniform for each pulse.

Moreover, in the abovementioned embodiment, the delay portion 23 can constitute appropriate timing means for starting a time count when the pulse oscillation synchronizing signal TR is input and generating a trigger signal to output the pulse oscillation synchronizing signal TR at the time when the abovementioned delay time $\tau$ is passed. Also, this delay portion 23 may comprise an integrator, which starts an integrating action when the pulse oscillation synchronizing signal TR is input, and a comparator to compare the output $\tau$ corresponding to the delay time and the output of this integrator and generate a trigger signal to output the pulse oscillation synchronizing signal TR when the results of the comparison match.

Moreover, in the present embodiment, the present invention is applied to a two-stage magnetic pulse compression circuit, but the present invention may also be applied to magnetic pulse compression circuits with three or more stages.

In the present embodiment, the maximum value of the power source voltage V0 is set so that the charge transfer time between capacitors matches the saturation time for the magnetic switches, specifically so that σ0–σ2 become zero. The power source voltage is controlled to remain in a range not to exceed this maximum voltage, but the present invention can be applied to devices which do not perform this type of power source voltage control.

Also, the present invention can be applied to semiconductor exposure devices which carry out exposure control using a step and scan system or a batch exposure system.

What is claimed is:

1. An emission timing control apparatus for a pulsed laser comprising:

a magnetic pulse compression circuit including a multistage charge transfer circuit comprised of a plurality of magnetic switches connected serially to a charging power source and a plurality of capacitors connected parallel to the charging power source, for compressing current pulses in a plurality of stages using the multistage charge transfer circuit;

switching means for carrying out a switching operation to connect and disconnect the charging power source to and from the magnetic pulse compression circuit;

a laser discharge electrode connected to an output terminal of the magnetic pulse compression circuit;

control means for outputting a voltage command value to the charging power source, wherein the laser executing pulsed laser oscillation at a predetermined repetition frequency by turning on the switching means via a pulse oscillation synchronizing signal having the predetermined repetition frequency received from a semiconductor exposure apparatus;

reference delay time setting means for setting a predetermined reference delay time, the predetermined reference delay time being greater than a maximum value of a variable range of a real emission delay time from when the switching means is turned on until laser oscillation begins;

delay time calculating means for calculating for each pulse oscillation a difference between the predetermined reference delay time for a pulse oscillation corresponding to the voltage command value output from the control means; and delay means for delaying the pulse synchronizing oscillation signal received from the semiconductor exposure apparatus by the time difference calculated in the delay time calculating means and outputting a delayed signal to the switching means.

2. The emission timing control apparatus for a pulsed laser according to claim 1, wherein the delay time calculating means finds a real emission delay time of the pulse oscillation according to an ambient temperature of the magnetic pulse compression circuit and the voltage command value output from the control means, and outputs a difference between the preset reference delay time and the real emission delay time of the pulse oscillation to the delaying means.

3. The emission timing control apparatus for a pulsed laser according to claim 2, wherein the voltage command value output from the control means is variably controlled between a predetermined lower limit value and a predetermined upper limit value; and the predetermined reference delay time set in the reference delay time setting means is set as a time from when the switching means is turned on until laser oscillation begins, when the laser oscillation is effected at a predetermined voltage value below the lower limit value below the lower limit value of the voltage command value.

4. The emission timing control apparatus for a pulsed laser according to claim 3, wherein the upper limit value of the voltage command value is established so that a charge transfer time among the capacitors matches a saturation time of the magnetic switch.

5. The emission timing control apparatus for a pulsed laser according to claim 1, wherein the voltage command value output from the control means is variably controlled between a predetermined lower limit value and a predetermined upper limit value; and the predetermined reference delay time set in the reference delay time setting means is set as a time from when the switching means is turned on until laser oscillation begins, when the laser oscillation is effected at a predetermined voltage value below the lower limit value of the voltage command value.

6. The emission timing control apparatus for a pulsed laser according to claim 5, wherein the upper limit value of the voltage command value is established so that a charge transfer time among the capacitors matches a saturation time of the magnetic switch.

7. The emission timing control apparatus for a pulsed laser according to claim 1, wherein the delay time calculating means finds the real emission delay time of the pertinent pulse oscillation corresponding to the voltage command value output from the control means by approximation calculation, with the below hyperbolic approximation equation:

$$td = (a/V_0) + b$$

where, $V_0$ is the power surge voltage, td is the real oscillation delay time corresponding to the voltage command value, and a and b are constants.

8. An emission timing control apparatus for a pulsed laser comprising:

a magnetic pulse compression circuit;

a charging power source;

switching means for carrying out a switching operation to connect and disconnect the charging power source to and from the magnetic pulse compression circuit;

a laser discharge electrode connected to an output terminal of the magnetic pulse compression circuit;

control means for outputting a voltage command value to the charging power source;

reference delay time setting means for setting a predetermined reference delay time, the predetermined reference delay time being greater than a maximum value of a variable range of a real emission delay time from when the switching means is turned on until laser oscillation begins;

delay time calculating means for calculating for each pulse oscillation a difference between the predetermined reference delay time for a pulse oscillation corresponding to the voltage command value output from the control means; and delay means for delaying a pulse oscillation synchronizing signal received from a semiconductor exposure apparatus by the time difference calculated in the delay time calculating means and outputting a delayed signal to the switching means.

* * * * *